United States Patent
Inaba

(10) Patent No.: US 7,736,544 B2
(45) Date of Patent: Jun. 15, 2010

(54) ELECTRICALLY CONDUCTIVE COMPOSITION FOR VIA-HOLES

(75) Inventor: Akira Inaba, Kaasaki (JP)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 11/789,904

(22) Filed: Apr. 26, 2007

(65) Prior Publication Data

US 2008/0268637 A1   Oct. 30, 2008

(51) Int. Cl.
*H01B 1/22* (2006.01)
*H05K 1/00* (2006.01)

(52) U.S. Cl. ............... 252/512; 252/513; 361/748; 427/97.7

(58) Field of Classification Search ......... 252/500–514; 428/209; 427/97.7; 361/748
See application file for complete search history.

(56) References Cited

U.S. PATENT DOCUMENTS

| | | | |
|---|---|---|---|
| 4,381,945 A * | 5/1983 | Nair ................ | 106/1.14 |
| 5,029,242 A | 7/1991 | Sammet | |
| 5,283,104 A * | 2/1994 | Aoude et al. ............ | 428/195.1 |
| 6,096,411 A * | 8/2000 | Nakatani et al. .......... | 428/209 |
| 6,139,777 A * | 10/2000 | Omoya et al. ............. | 252/500 |
| 6,337,037 B1 * | 1/2002 | St. John ................. | 252/514 |
| 6,406,774 B1 * | 6/2002 | Banba et al. ............. | 428/139 |
| 2002/0050586 A1 * | 5/2002 | Oshita et al. ............. | 252/500 |
| 2004/0013860 A1 * | 1/2004 | Sumi et al. .............. | 428/209 |
| 2006/0248383 A1 * | 11/2006 | Urakawa ................. | 714/10 |
| 2007/0080329 A1 * | 4/2007 | Nomiya et al. ........... | 252/500 |
| 2007/0235694 A1 * | 10/2007 | Nair et al. ............... | 252/500 |

FOREIGN PATENT DOCUMENTS

| EP | 1717855 A1 | 11/2006 |
|---|---|---|
| JP | 2003-324268 | 11/2003 |

\* cited by examiner

*Primary Examiner*—Mark Kopec
*Assistant Examiner*—Tri V Nguyen

(57) ABSTRACT

The present invention relates to an electrically conductive composition for filling via-holes formed in an electronic circuit substrate containing an electrically conductive metal and a vehicle, wherein the content of the electrically conductive metal is 57 vol % or more, and the composition is a plastic fluid for which fluidity increases when external pressure is applied to the composition.

5 Claims, 8 Drawing Sheets

(a)

Firing (b)

ELECTRICALLY CONDUCTIVE COMPOSITION FOR VIA-HOLES

BACKGROUND OF THE INVENTION

1. Field of the Invention

The present invention relates to an electrically conductive composition used to fill via-holes provided in ceramic or glass substrates or the like, and more particularly to an electrically conductive composition that is able to prevent entrapment of air when printing an electrically conductive composition into via-holes. In addition, the present invention relates to electronic components using this electrically conductive composition and to a method for producing those electronic devices.

2. Technical Background

Sites referred to as via-holes filled with an electrically conductive metal are formed in single-layer circuit substrates or laminated circuit substrates, in which a plurality of circuit substrates have been laminated, to improve continuity in the vertical direction (both directions or the direction of lamination) or thermal conductivity. An example of a typical process used to form these via-holes comprises: (1) preparing an electrically conductive paste, (2) filling the electrically conductive paste into sites where holes corresponding to via-holes are formed, and (3) drying and firing the paste.

An example of the art relating to an electrically conductive paste for via-holes is JP2003-324268. A paste containing 31.3 to 47.6 vol % of an electrically conductive metal (Ag) is used in the examples of JP2003-324268.

The paste is typically filled by screen printing. As shown in FIG. 1 (conventional art), an electrically conductive paste 10 is filled into holes on a substrate 20 through a metal mask 30. Since the paste has a certain degree of viscosity, when the paste is supplied, it may flow into the hole along the side walls of the hole and entrap air. If the paste is pushed into the hole using a squeegee 40 while in this state, the paste is filled into the hole with air still entrapped therein, thus, forming an air void 50. This entrapment of air is particularly prominent in cases of holes having a large diameter.

Thus, air is entrapped in via-holes with electrically conductive paste during via-hole printing. This causes structural defects such as voids and pin-holes after firing the substrate. These defects have a detrimental influence on electrical and thermal conductivity as well as on the smoothness of the fired surface.

SUMMARY OF THE INVENTION

An object of the present invention is to provide an electrically conductive composition having a high solid content, with metal powder having a high packing density for filling via-holes in a substrate in which an electronic circuit has been formed thereon wherein the conductive composition is able to eliminate the entrapment of air from the via-holes.

One aspect of the invention relates to an electrically conductive composition for filling via-holes formed in an electronic circuit substrate, comprising an electrically conductive metal and a vehicle, wherein a content of the electrically conductive metal is 57 vol % or more, and the electrically conductive composition is a plastic fluid for which fluidity increases when external pressure is applied to the composition. The electrically conductive metal is generally a metal selected from the group consisting of gold, silver, copper, palladium, platinum, nickel and aluminum, or an alloy thereof.

Another aspect of the present invention relates to a method for production of electronic device comprising the steps of: preparing an electronic circuit substrate in which a through-hole is formed; filling an electrically conductive composition containing an electrically conductive metal and a vehicle into the through-hole, the content of the electrically conductive metal being 57 vol % or more, and the electrically conductive composition being a plastic fluid for which fluidity increases when external pressure is applied to the composition; and firing the electronic circuit substrate.

Another aspect of the present invention relates to an electronic device produced according to the above-mentioned method for production of electronic device.

The electrically conductive composition of the present invention prevents air from being entrapped in via-holes during the printing process.

DETAILED DESCRIPTION OF THE INVENTION

Figure 1:
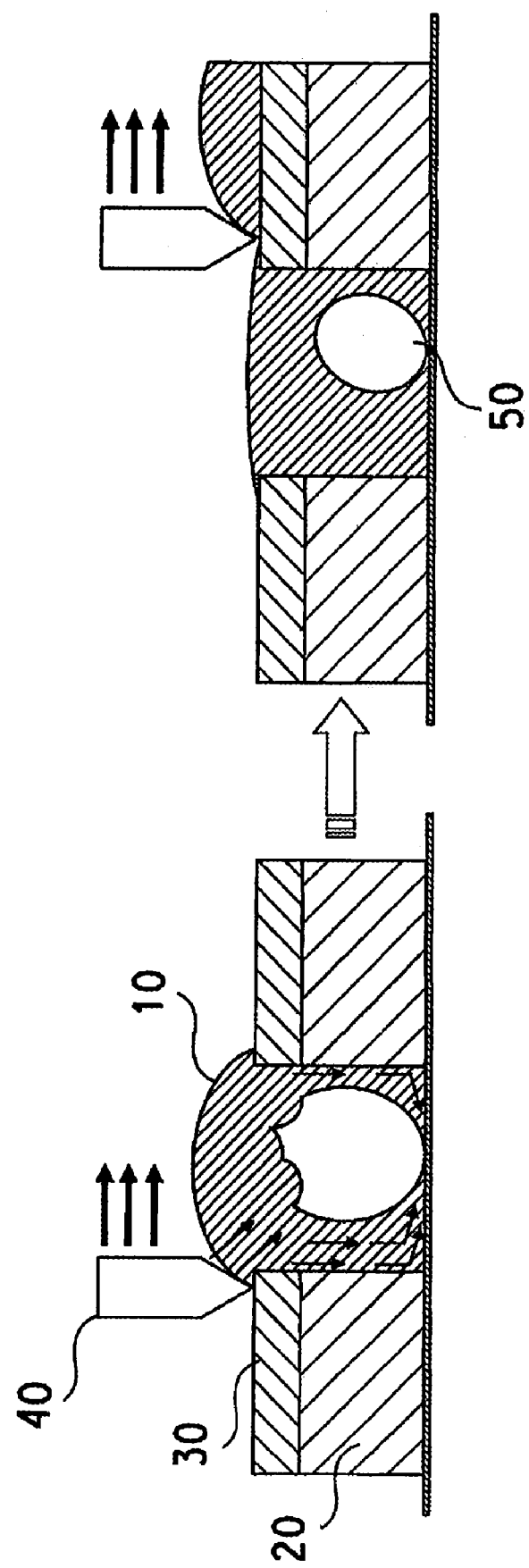
FIG. 1 is a schematic drawing showing the mechanism by which air voids are formed (conventional art)

The present invention is an electrically conductive composition for filling via-holes formed in an electronic circuit substrate. This electrically conductive composition contains an electrically conductive metal and a vehicle, the content of the electrically conductive metal is 57 vol % or more, and the composition is a plastic fluid for which fluidity increases when external pressure is applied to the composition.

The following provides an explanation of each component of the electrically conductive composition of the present invention.

1. Electrically Conductive Metal

The electrically conductive metal is preferably an electrically conductive powder. Although there are no particular limitations on the type of metal, when applying to a low temperature co-sintered ceramic (LTCC) substrate, the electrically conductive metal powder is preferably a metal powder having a high conductivity, such as metals selected from the group consisting of gold, silver, copper, palladium, platinum, nickel and aluminum, or an alloy thereof and mixtures thereof.

Although there are no particular limitations on the mean particle diameter of the electrically conductive metal powder, in one embodiment it is 0.1 to 10 μm; it is preferably 0.8 to 8 μm and more preferably 1 to 6 μm. By using an electrically conductive metal powder having a particle diameter within this range, entrapment of air within the via-holes is effectively inhibited.

Although various shapes such as spheres or flakes can be used for the shape of the electrically conductive metal powder, it is preferably spherical. In the case of using a spherical electrically conductive metal powder, in addition to fluidity being maintained in the case of applying external pressure even if the electrically conductive metal in the paste exceeds 57 vol %, packing density after printing and drying can be increased.

2. Vehicle

There are no particular limitations on the type of vehicle. Examples of vehicles that can be used include organic mixtures of a binder resin (such as an ethyl cellulose resin, acrylic resin, rosin-modified resin or polyvinyl butyral resin) and an organic solvent (such as butyl carbitol acetate (BCA), terpineol, ester alcohols, BC or TPO).

The electrically conductive composition of the present invention is characterized by having a high content of electrically conductive metal, and as a result thereof, the composition of the present invention becomes a plastic fluid for which fluidity increases when external pressure is applied to the composition. Furthermore, in the present description, a "plastic fluid" refers to a fluid having plasticity in which fluidity increases when external pressure is applied to the composition. In the present invention, the term "plastic fluid" particularly refers to that which does not demonstrate fluidity in the case of allowing the composition to stand undisturbed on an electronic circuit substrate during ordinary printing and so on, but does demonstrate fluidity when an external pressure such as physical pressure or thermal energy is applied. In the case of the presence or absence of fluidity being dependent on temperature, the presence of fluidity at 25° C. is defined as "having fluidity" in the present application.

The electrically conductive composition of the present invention is a plastic fluid as defined above. Although the reasons for the electrically conductive composition of the present invention becoming a plastic fluid are not clear, it is believed to involve the following factors.

When the content of an electrically conductive metal in an electrically conductive of the present invention increases, the behavior of the composition changes to that of a fluid. Namely, in the case of a low content of electrically conductive metal, the electrically conductive metal is in the state of being dispersed in the vehicle. On the other hand, when the content of electrically conductive metal is high, an adequate amount of vehicle is not present around the electrically conductive metal powder. For example, an electrically conductive composition containing an electrically conductive metal equal to or greater than a predetermined content has a shortage of vehicle for filling in the gaps in the electrically conductive metal powder. In such a state, the probability of mutual contact between the electrically conductive metal powder in the composition increases, and fluidity is lost when allowed to stand undisturbed. On the other hand, since the bonding strength associated with mutual contact between the electrically conductive metal powder is weak, the composition is easily able to become fluid if an external pressure is applied, thereby resulting in the composition demonstrating fluidity. Thus, for example, since the electrically conductive composition of the present invention has a higher electrically conductive metal content than ordinary electrically conductive compositions, fluidity is demonstrated when the composition is filled into the via-holes as a result of external pressure being applied by a filling device such as a squeegee.

In general, air is easily entrapped in via-holes when an electrically conductive composition is filled into via-holes. However, if the electrically conductive composition of the present invention is used, since the composition is in a solid state when put on the substrate, fluidity occurs due to external pressure when the composition is filled into the via-holes with a squeegee and so on, thereby allowing the composition to be filled from the top of the holes to the bottom of the holes without entrapping air therein. Thus, entrapment of air in the holes is reduced considerably.

The content of the electrically conductive metal that enables the electrically conductive composition of the present invention to demonstrate the behavior of a plastic fluid in this manner is 57 vol % or more. Furthermore, the content as referred to in the present application is determined as the value based on the total volume of the electrically conductive composition.

The content of the electrically conductive metal is preferably 57 to 75 vol %, more preferably 60 to 72 vol %, and even more preferably 63 to 70 vol %. If the content of the electrically conductive metal is excessively low, the effect of reducing the entrapment of air in the via-holes diminishes. If the content of the electrically conductive metal is excessively high, it becomes difficult to secure fluidity even if external pressure is applied to the electrically conductive composition.

The packing density of the composition of the present invention in the case of drying the composition is preferably 50% or more. If the packing density is less than 50%, metal powder shrinkage during the firing increases and cracks form between the walls of the via-holes and the electrically conductive composition. In addition, due to the large firing shrinkage, an adequate amount of conductor is unable to be secured after firing in the via-holes.

The electrically conductive composition of the present invention can also incorporate other components in addition to the electrically conductive powder and the organic vehicle. For example, inorganic oxides, compound oxides of inorganic oxides or metal resinates are preferably incorporated. Firing shrinkage of the electrically conductive metal can be controlled if these compounds are contained in the composition of the present invention. For example, in the case of co-firing this composition with a ceramic green sheet, structural defects such as cracks and delamination can be prevented by matching the firing shrinkage of the electrically conductive metal with the firing shrinkage of the ceramic green sheet.

Examples of inorganic oxides include oxides that do not melt at a temperature of 900° C. or lower selected from the group consisting of $Al_2O_3$, $SiO_2$, $TiO_2$, MnO, MgO, $ZrO_2$, CaO, BaO and $Co_2O_3$. Examples of compound oxides of inorganic oxides include $BaTiO_3$, $CaTiO_3$ and $MgTiO_3$. Examples of metal resonates include metal resonates of Pt, Pd, Rh, Mn, Ti, Zr, Ca and Co.

The content of the inorganic oxides, compound oxides of inorganic oxides and metal resonates is preferably 0.1 to 10 wt % and more preferably 0.2 to 5 wt % based on the total weight of the composition, and the combined content of the electrically conductive metals is 57 vol % or more. Since inorganic oxides and compound oxides of inorganic oxides are typically not electrically conductive, and inhibit sintering of the metal during firing, there is the risk of having a detrimental effect on electrical conductivity if contained in excess.

On the other hand, even if contained at 10 wt % or less, in the case the particle diameter is large; the effect of inhibiting sintering of the electrically conductive metal diminishes.

Accordingly, the mean particle diameter of the inorganic oxide, compound oxide of an inorganic oxide and metal resinate is preferably 0.03 to 5 µm and more preferably 0.03 to 2 µm.

An example of other components of the electrically conductive composition of the present invention is glass powder. Glass powder is incorporated to improve adhesive strength between the ceramic after firing and the fired composition. The content of the glass powder is preferably 0.1 to 10 wt % and more preferably 0.2 to 5 wt % based on the total weight of the composition. For similar reasons as the inorganic oxides and so on described above, the mean particle diameter of the glass powder is preferably 0.1 to 5 µm and more preferably 0.3 to 3 µm.

The electrically conductive composition of the present invention is produced as desired by mixing each of the above-mentioned components with a triple roll mill and so on.

The following provides an explanation of an electronic device of the present invention.

Figure 2:
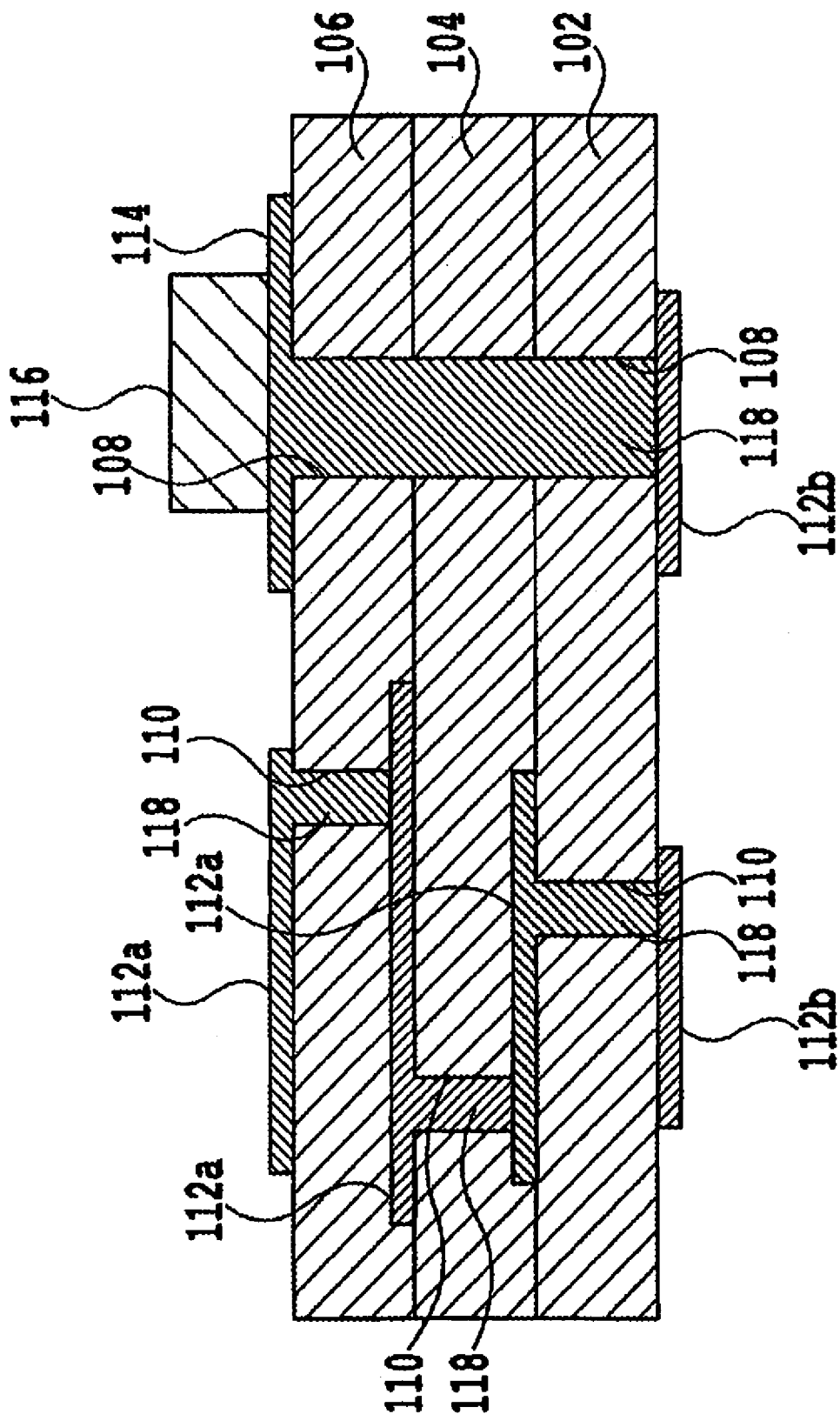
FIG. 2 is a longitudinal cross-sectional view schematically showing an example of an electronic device of the present invention in the form of a low temperature co-fired ceramic multilayer circuit substrate.

An example of an electronic device of the present invention is shown in FIG. 2. FIG. 2 is a longitudinal cross-sectional view schematically showing an example of a low temperature co-fired ceramic multilayer circuit substrate as one embodiment of the present invention. Furthermore, the present invention is not limited to the embodiment shown in FIG. 2, but rather can be applied to any electronic device having via-holes. For example, the present invention can be applied to an electronic device produced by a process other than LTCC.

As shown in FIG. 2, the electronic device has substrates 102, 104 and 106 of predetermined dimensions laminated in a plurality of layers, and via-holes 108 and 110 are provided at predetermined locations in each substrate. In addition, various types of circuit components such as resistors and wiring patterns 112*a* and 112*b* are formed on one or both sides of each substrate, and a mounting component 116 is mounted on a mounting land 114. The via-holes 108 and 110 are filled with a via-conductor 118. This via-conductor is the above-mentioned electrically conductive composition of the present invention.

In this electronic device of the present invention, glass and so on can be used for the substrate material in addition to ceramics. Examples of materials that can be used for the ceramic include aluminum oxide, aluminum nitride, zirconium oxide, silicon carbide and silicon nitride. Known silica-based glass can be used for the glass. Substrates composed of these materials can typically be obtained by firing a green sheet.

In the example of the composition shown in FIG. 2, the via-hole 108 having the larger diameter is a thermal via for dissipating heat from the mounting component 116, while the via-hole 110 having the smaller diameter is a via-hole for interconnecting the wiring patterns 112*a* and 112*b* between layers.

As a result of using the electrically conductive composition of the present invention, since a paste can be filled into the via-holes while inhibiting the entrapment of air in the via-holes in the electronic device of the present invention, the electrical conductivity, thermal conductivity and surface smoothness of the material filled into the via-holes can be improved.

Next, an explanation is provided of a process for producing an electronic device of the present invention. The method of the present invention for production of electronic device comprises a step for preparing an electronic circuit substrate in which through-holes are formed, a step for filling an electrically conductive composition containing an electrically conductive metal and a vehicle into the through-holes, the content of the electrically conductive metal in the electrically conductive composition being 57 vol % or more, and the electrically conductive composition being a plastic fluid for which fluidity increases when external pressure is applied thereto, and a step for firing the electronic circuit substrate into which this electrically conductive composition has been filled.

Figure 3:
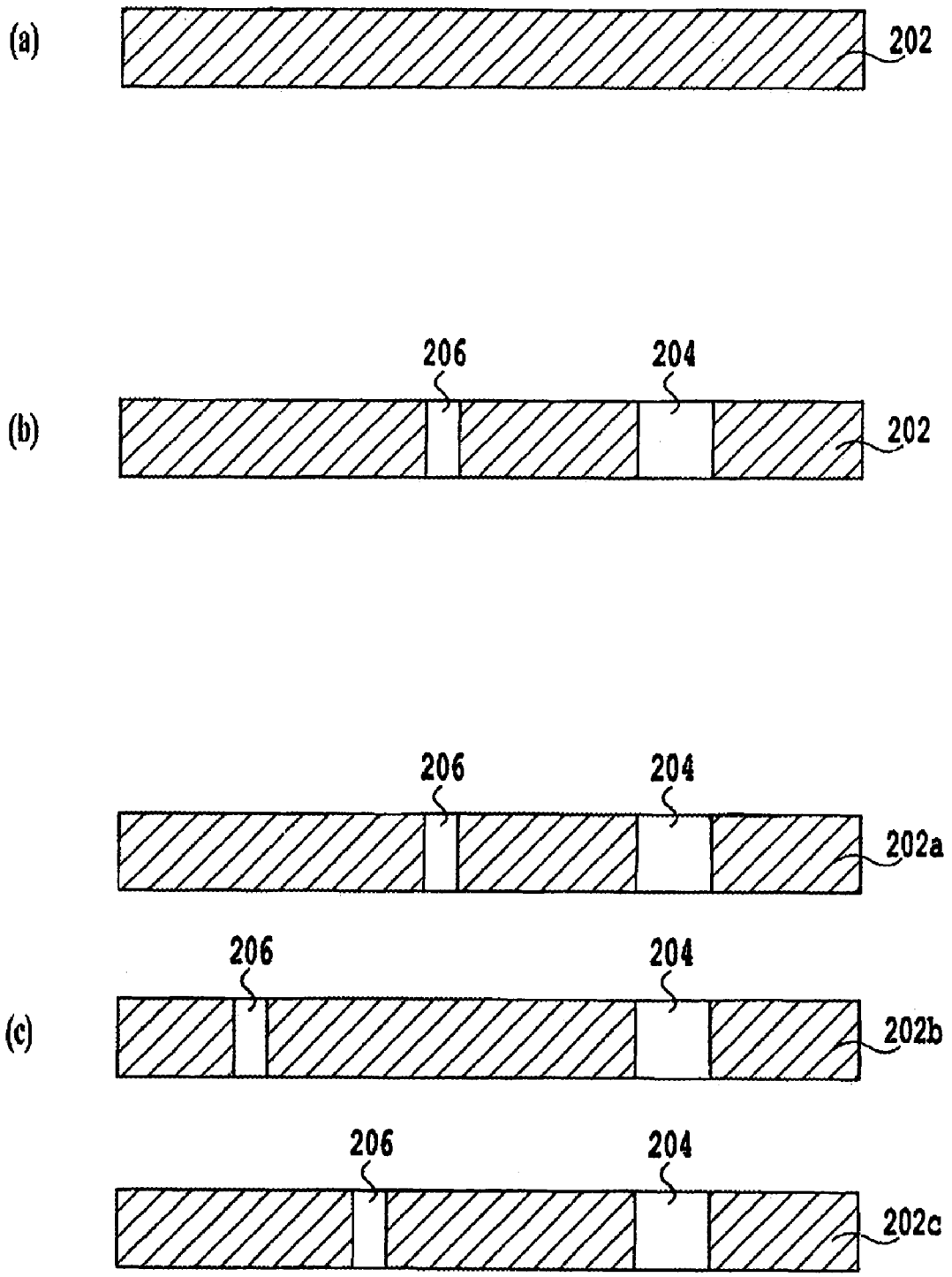
FIGS. 3A to 3C are drawings for explaining a production process of an electronic device of the present invention in the form of a low temperature co-fired ceramic multilayer circuit substrate (first step)
Figure 4:
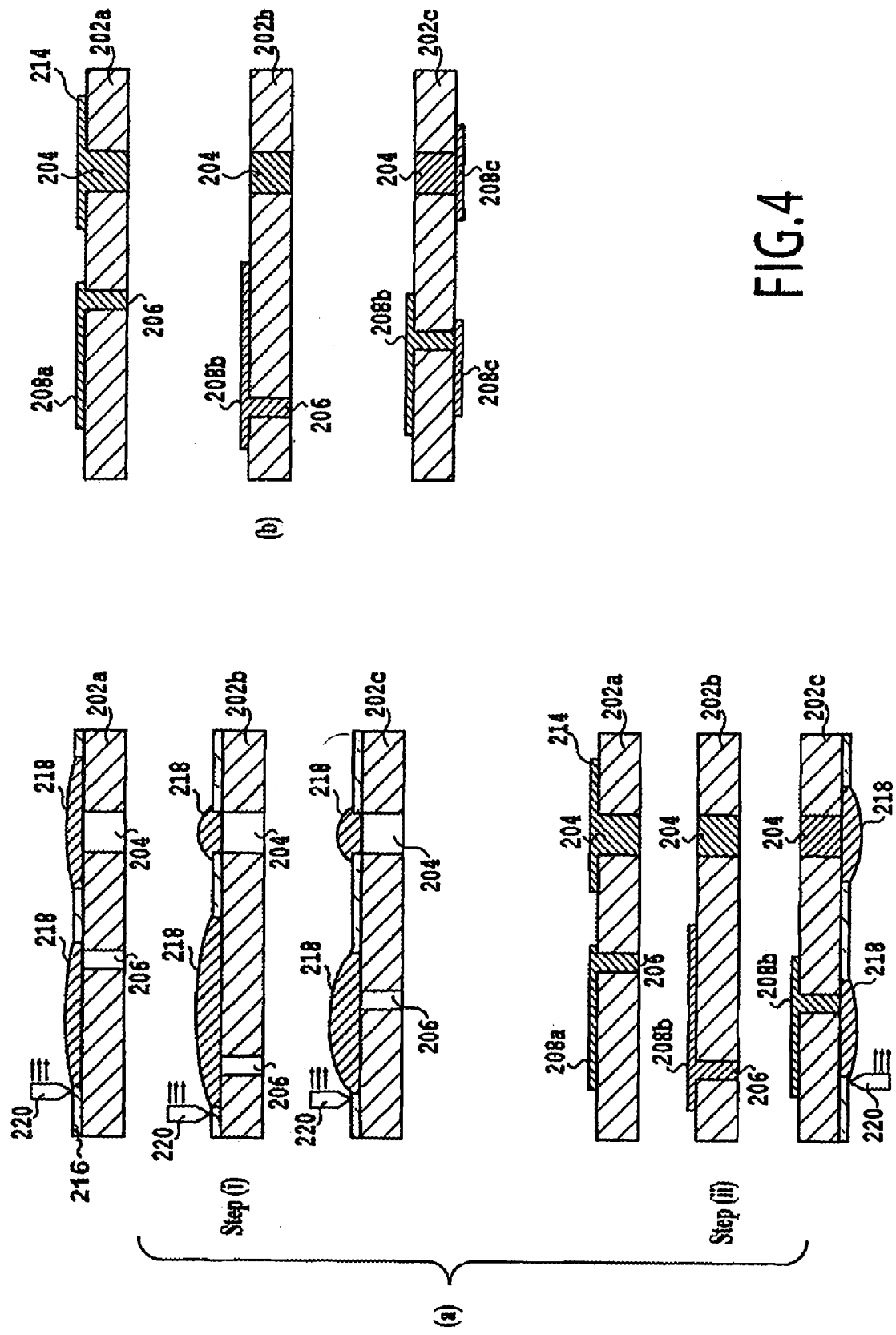
FIGS. 4A and 4B are drawings for explaining a production process of an electronic device of the present invention in the form of a low temperature co-fired ceramic multilayer circuit substrate (second step)
Figure 5:
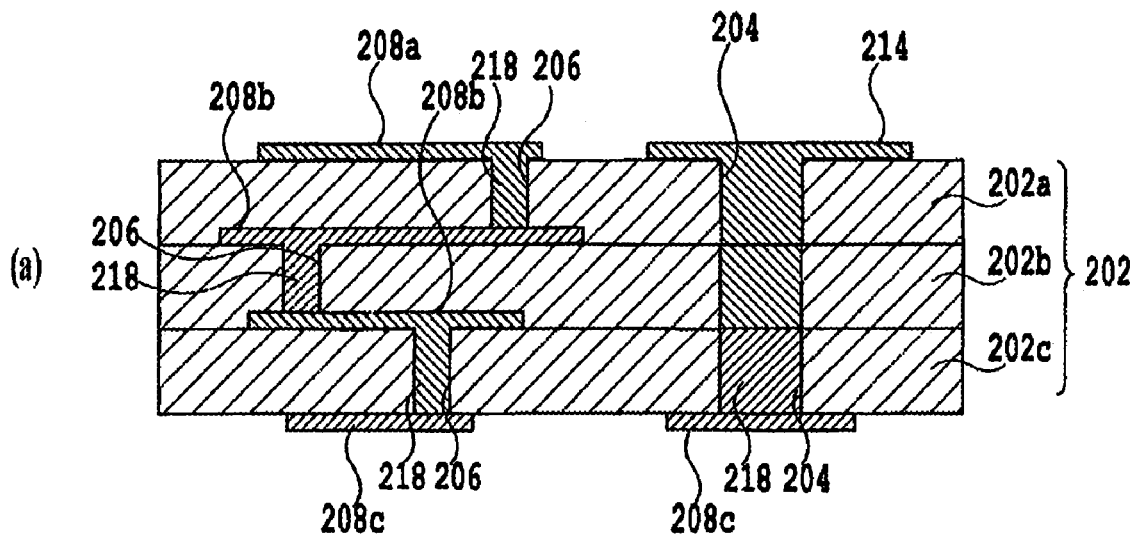
FIGS. 5A and 5B are drawings for explaining a production process of an electronic device of the present invention in the form of a low temperature co-fired ceramic multilayer circuit substrate (third step)
Figure 5:
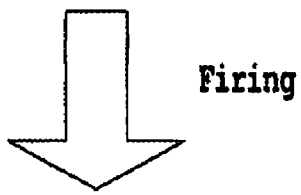
Figure 5:
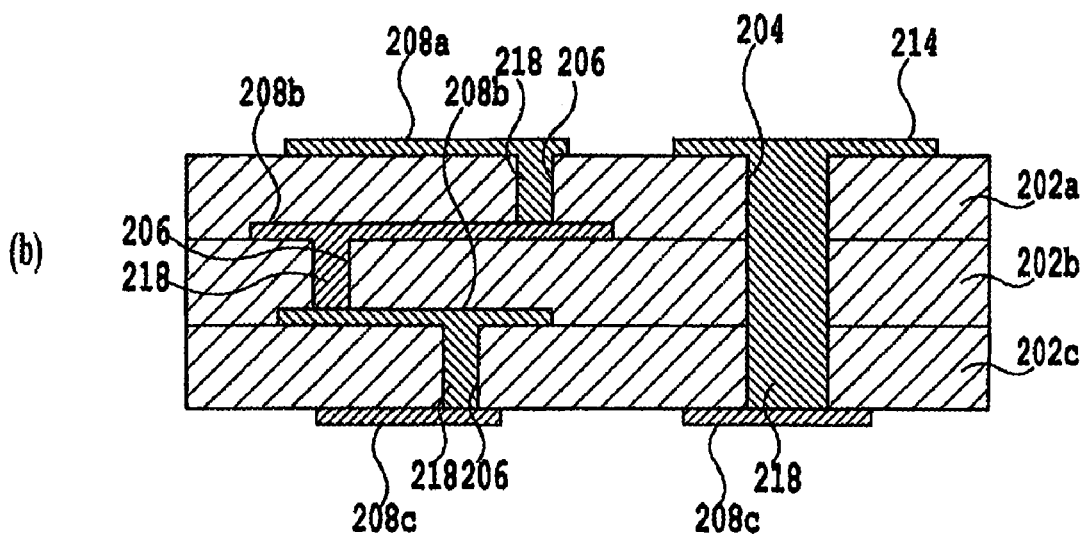

The following provides an explanation of a production process for a low temperature co-fired ceramic multilayer electronic circuit substrate as one embodiment of an electronic device with reference to FIGS. 3 to 5.

An explanation is first provided of the first step of the production process of the present embodiment (see FIG. 3). In the first step, an electronic circuit substrate is prepared in which through-holes have been formed. Furthermore, in the present description, the term "electronic circuit substrate" refers to the concept that includes a substrate prior to firing such as a green sheet in which through-holes have been formed or a green sheet in which through-holes and circuit patterns have been formed.

First, a slurry for a low temperature co-fired ceramic is molded into the form of a tape by a doctor blade method and so on, and then the tape is cut to predetermined dimensions to fabricate a low temperature co-fired ceramic green sheet 202 (FIG. 3A).

Examples of low temperature co-fired ceramics include mixtures of 50 to 65 wt % of CaO—$SiO_2$—$Al_2O_3$—$B_2O_3$-based glass and 50 to 35 wt % of alumina. Other examples of low temperature co-fired ceramic materials that may be used include those able to be fired at 800 to 1000° C. such as a mixture of MgO—$SiO_2$—$Al_2O_3$—$B_2O_3$-based based glass and alumina, a mixture of $SiO_2$—$B_2O_3$-based glass and alumina, a mixture of PbO—$SiO_2$—$B_2O_3$-based glass and alumina, and cordierite-based crystallized glass.

Next, through-holes 204 and 206 serving as via-holes are punched at predetermined locations in this green sheet 202 (FIG. 3B).

Furthermore, examples of methods for forming these through-holes serving as via-holes include (i) a method in which through-holes of a predetermined size are formed in a green sheet by punching followed by firing, and (ii) a method in which through-holes are formed in a fired electronic circuit substrate by laser forming, sandblasting or electron beam forming and so on to serve as via-holes.

Although there are no particular limitations on the size of the through-holes for the paste composition, they are preferably of a size such that the surface area of the through-holes in the plane parallel to the substrate plane is 0.25 $mm^2$ or more. More specifically, in the case of circular through-holes, a comparatively large diameter of 1 mm or more is preferable for the composition. The reason for this is that, in the case of filling paste into through-holes having a large diameter such as this, there is particular susceptibility to entrapment of air, and by using the production process of the present invention, this entrapment of air can be effectively inhibited. In the constitution shown in FIG. 3, the large-diameter through-hole 204 is a through-hole for forming a thermal via for dissipating heat of a mounting component, while the small-diameter through-hole 206 is a via-hole for connecting interlayer wiring patterns.

In the case of laminating green sheets in the manner of a low temperature co-fired ceramic multilayer circuit substrate, via-holes are punched so as to connect wiring patterns. Thus, it is not necessary that through-holes be provided at the same locations in the green sheets. Furthermore, through-holes for dissipating heat in the manner of thermal vias are preferably all punched at the same location from the viewpoint of thermal diffusivity efficiency.

A number of green sheets in which through-holes have been formed in the manner described above are formed equal to the number of layers to be laminated (FIG. 3C). FIG. 3 shows an example in the case of forming three layers of green sheets 202a, 202b and 202c.

Next, an explanation is provided of the second step (see FIG. 4). In the second step, an electrically conductive composition is filled into the formed through-holes 204 and 206. Filling of the electrically conductive composition is typically carried out by printing.

In the case of a low temperature co-fired ceramic multilayer circuit substrate, filling of the through-holes 204 and 206 of the green sheets 202 may be carried out simultaneous to printing of a wiring pattern from the viewpoint of reducing production costs. Furthermore, a top layer wiring pattern 208a, inner layer wiring patterns 208b, a bottom layer wiring pattern 208c, filled portions of through-holes 204 and 206, and a component mounting land 214 are shown in FIG. 4. Here, the green sheet 202b serves as an inner layer when laminated, while the wiring patterns 208b serve as inner layer wiring patterns. Moreover, the wiring pattern 208b of the green sheet 202c on the side that contacts the green sheet 202b also serves as an inner layer wiring pattern 208b when the green sheet 202c is laminated.

In the simultaneous printing step, a screen mask 216, in which a printing pattern is formed for filling the through-holes 204 and 206 and for carrying out printing of the wiring patterns 208a and 208b, is placed on the green sheets 202, an electrically conductive composition 218 is supplied to this screen mask, and a squeegee 220 is slid along the upper surface of the screen mask to fill the through-holes 204 and 206 while simultaneously carrying out printing of the wiring patterns 208a and 208b. This is carried out for each green sheet 202a, 202b and 202c (FIG. 4A).

Furthermore, the inner layer wiring pattern 208b on the upper surface of the green sheet 202c of the lowermost layer is printed simultaneous to filling the through-holes 204 and 206 (FIG. 4A, Step (i)), after which the bottom layer wiring pattern 208c is printed on the lower surface of this lowermost green sheet 202c (FIG. 4A, Step (ii)). Printing of this bottom layer wiring pattern 208c may be carried out following lamination or firing of the green sheets 202a, 202b and 202c to be described later. On the other hand, a conductor pattern other than a wiring pattern, such as the component mounting land 214, is preferably simultaneously formed on the upper surface of the uppermost green sheet 202a when printing the top layer wiring pattern 208a simultaneous to filling the through-holes 204 and 206. Furthermore, printing of the top layer wiring pattern 208a and component mounting land 214 and so on may be carried out following lamination or firing of the green sheet 202c to be described later. In the process described above, the electrically conductive composition of the present invention can be coated onto the top layer wiring pattern 208a, the inner layer wiring patterns 208b, the bottom layer wiring pattern 208c and the component mounting land 214, and filled into the through-holes 204 and 206 (FIG. 4B).

The following provides an explanation of a third step in the form of a firing step (see FIG. 5).

First, after completing the second step, each of the resulting green sheets is laminated and pressed together (FIG. 5A). Each layer consisting of green sheets 202a, 202b and 202c is laminated, and this laminate is integrated into a single unit by hot-pressing under conditions of, for example, 60 to 150° C. and 0.1 to 30 MPa (and preferably 1 to 10 MPa).

Next, firing is carried out (arrow in FIG. 5). More specifically, the green sheet laminate 202 may be fired under conditions of, for example, holding for 20 minutes at 800 to 1000° C. (and preferably 900° C.). The green sheet laminate 202 is fired simultaneously with the electrically conductive composition 218 filled into the top layer, as well as inner layer and bottom layer wiring patterns 208a, 208b and 208c to produce a low temperature co-fired ceramic multilayer circuit substrate (FIG. 5B).

In the case the electrically conductive composition 218 filled into the top layer, inner layer and bottom layer wiring patterns 208a, 208b and 208c and the through-holes 204 and 206 is printed with a precious metal-based (e.g., Ag-based or Au-based) electrically conductive composition that does not oxidize during firing, it can be fired in air (in an oxidative atmosphere). On the other hand, in the case the wiring patterns are printed and the through-holes are filled with a metal-based oxidative electrically conductive composition such as a Cu-based composition that is susceptible to oxidation, it is preferably fired in an inert atmosphere (non-oxidative atmosphere) such as nitrogen gas to prevent oxidation of the electrically conductive composition.

Furthermore, in the firing step, a low temperature co-fired ceramic multilayer circuit substrate can be produced by laminating alumina green sheets on both sides of the green sheet laminate 202 and firing while applying pressure. This pressurized firing method comprises firing at 800 to 1000° C. while applying pressure to the laminate on which alumina green sheets have been laminated on both sides thereof, followed by removing the remnants of the alumina green sheets from both sides of the fired substrate by blasting treatment and so on. This pressurized firing method offers the advantage of being able to improve dimensional accuracy of the substrate by inhibiting contraction of the substrate due to firing.

Following firing, a mounting component can be mounted as necessary to produce an electronic device as shown in FIG. 2.

Drying conditions and firing conditions in applications other than LTCC may be set by suitably referring to known findings in consideration of the substrate used and application. For example, in the case of using a ceramic or glass substrate for the electronic circuit substrate, after filling and printing a composition with a printing method, the composition is preferably dried for 5 to 60 minutes at a temperature within the range of 70 to 200° C. and then fired in a belt oven or box oven and so on for a total baking time within the range of 20 to 120 minutes and holding for 5 to 30 minutes at a top temperature within the range of 450 to 900° C.

An electronic device produced using the electrically conductive composition of the present invention is used in various applications, examples of which include high-frequency circuits of cellular telephones and heat sink circuits of LEDs.

Example

Although the following provides a more detailed explanation of the present invention through examples thereof, these examples are only exemplary of the present invention, and do not limit the present invention in any way.

In the present examples, the substrate material used, each material of the electrically conductive composition, printing and drying of the substrate, and evaluation results are as described below.

(1) Substrate

A 2-inch $Al_2O_3$ (96%) substrate having a thickness of 0.6 mm (Kyocera substrate) was used for the substrate.

(2) Via-Hole Formation

Square via-holes measuring 2.8 mm on a side and 1.0 mm on a side were formed in the above-mentioned $Al_2O_3$ substrate by sandblasting.

(3) Electrically Conductive Compositions

Electrically conductive compositions were prepared for each example and comparative example having the compositions shown in Table 1. The silver density and vehicle density indicated below were used to prepare the electrically conductive compositions, and the volume of the metal (silver) component in the composition was calculated.

(a) Silver density: 10.5 g/cm³
(b) Cellulose or vehicle density: 1.0 g/cm³

The electrically conductive compositions were prepared by kneading each material with a triple roll mill.

(4) Printing

The electrically conductive compositions were filled into the substrate via-holes described above and dried under the conditions indicated below.

Printing: Use of a stainless steel metal mask having a thickness of 150 μm

Use of a Newlong automatic printing machine
Use of a urethane (hardness: 70) squeegee
Drying: Dried for 30 minutes at 80° C. with a box dryer Compositions identified as "viscous material" are defined herein as rheological compositions comprising powder and vehicle that had fluidity without external force at 25° C.

(5) Substrate Evaluation Method

Substrates that had been printed with the electrically conductive compositions and dried were observed for the presence of air voids in the via-holes with a light microscope (magnification: 20×).

<Substrate Evaluation Criteria>

The substrates in the table above were evaluated based on the criteria indicated below.

OK: One or fewer air voids having a diameter of 100 μm or more and no air voids having a diameter of 400 μm or more per 1 mm² unit surface area.

Marginal: More than 1 but less than 2 air voids having a diameter of 100 μm or more and no air voids having a diameter of 400 μm or more per 1 mm² unit surface area.

NG: 2 or more air voids having a diameter of 100 μm or more and 1 or more air voids having a diameter of 400 μm or more per 1 mm² unit surface area.

In addition, on the basis of the above results, the effects of the present invention were observed for those electrically conductive compositions having equal to or greater than a predetermined silver content (vol %) regardless of the type of vehicle. Thus, the plastic fluidity of the electrically conductive composition of the present invention is thought to be determined by the volume percentage of the electrically conductive particles.

Figure 6:
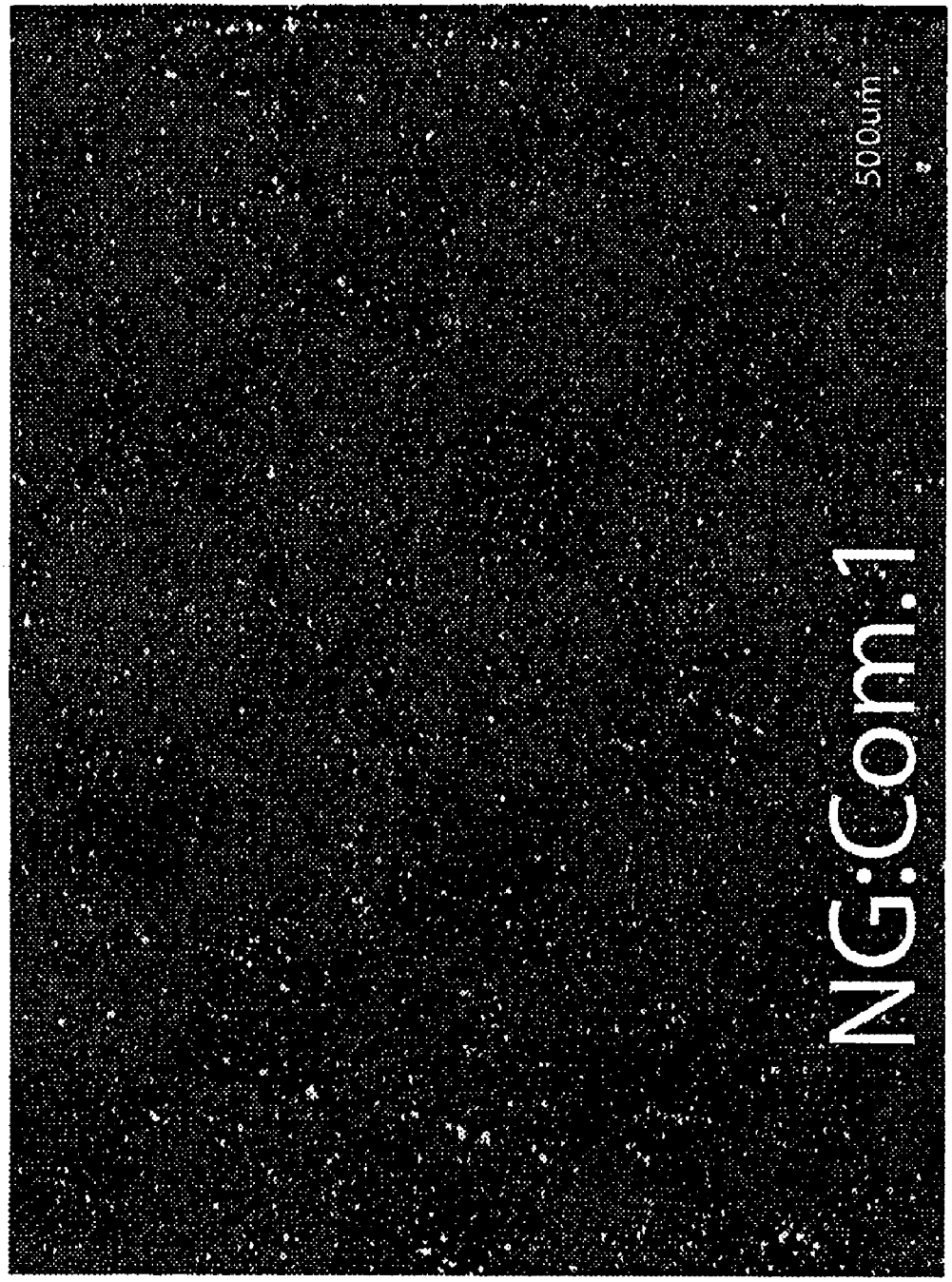
FIG. 6 is a micrograph showing the surface profile after firing for Comparative Example 1.
Figure 7:
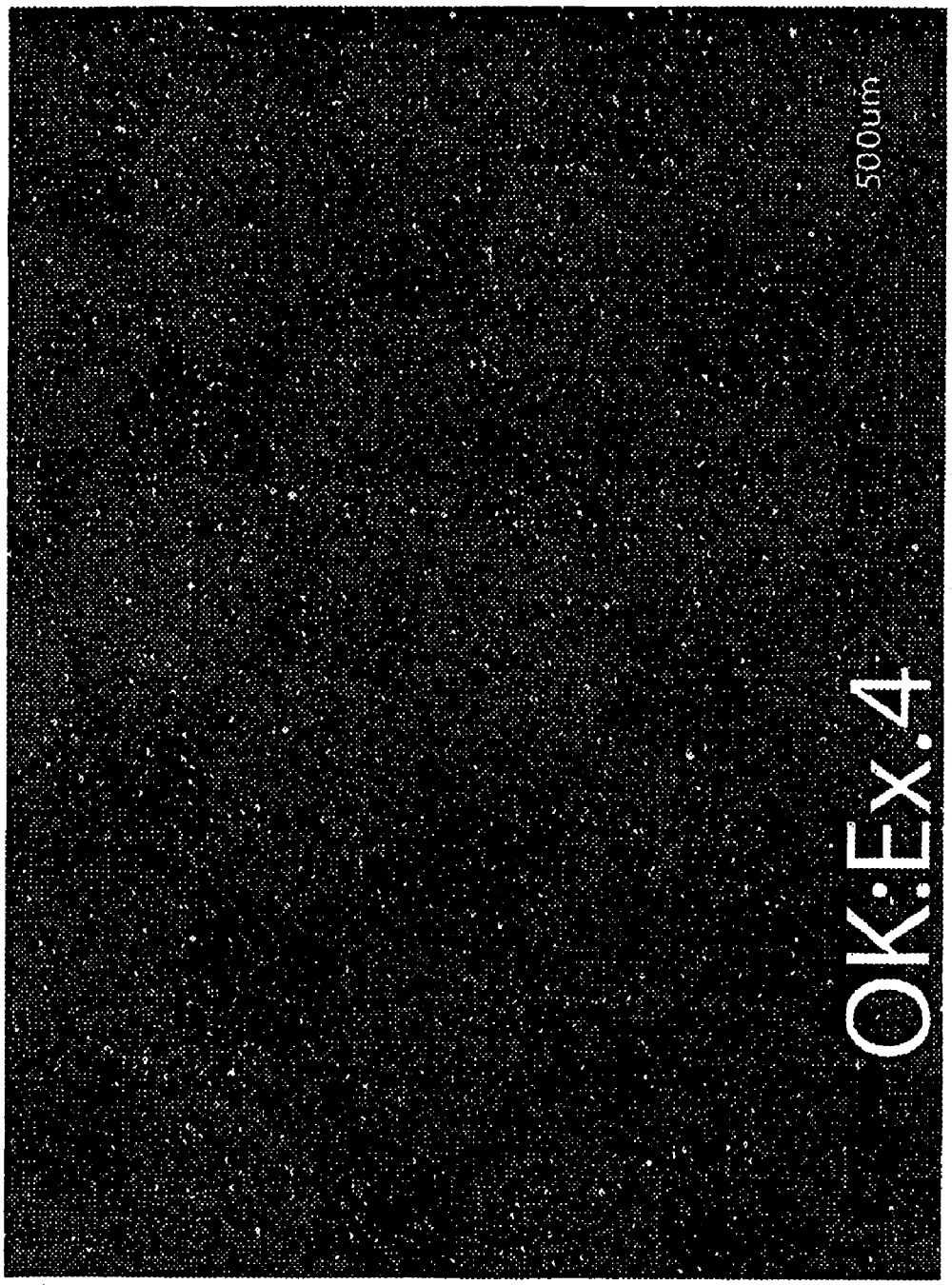
FIG. 7 is a micrograph showing the surface profile after firing for Example 4.
Figure 8:
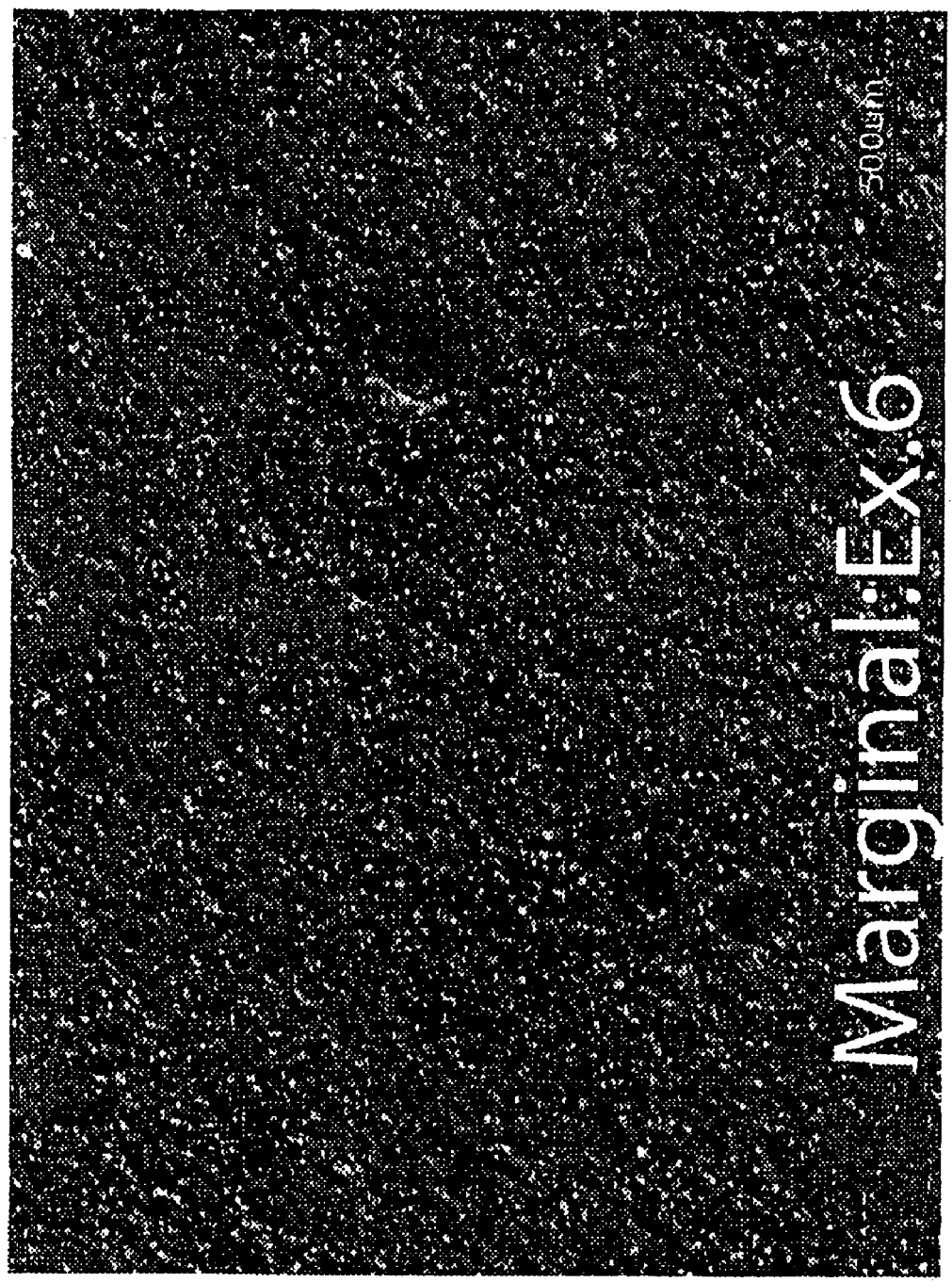
FIG. 8 is a micrograph showing the surface profile after firing for Example 6.

In addition, FIGS. 6 to 8 show the results of observing the surface profiles of each of the compositions of Comparative Example 1, Example 4 and Example 6 after firing by metal electron micrographs.

As is clear from the results of these micrographs, the composition of the present invention is able to significantly inhibit the formation of air voids.

What is claimed is:

1. An electrically conductive composition for filling via-holes formed in an electronic circuit substrate, comprising an electrically conductive metal and a vehicle, wherein the content of the electrically conductive metal is 63 vol % to 70 vol %, and the electrically conductive composition is a plastic fluid for which fluidity increases when external pressure is applied to the composition, further comprising glass powder at 0.2 to 5 wt % based on the total weight of the composition and an inorganic oxide that does not melt at a temperature of

TABLE 1

| | Ex. 1 | Ex. 2 | Ex. 2-1 | Ex. 3 | Ex. 4 | Ex. 5 | Ex. 5-1 | Ex. 6 | Comp. Ex. 1 | Comp. Ex. 2 |
|---|---|---|---|---|---|---|---|---|---|---|
| Vol % of metal powder | 69.9% | 64.4% | 65.0% | 59.9% | 69.9% | 64.4% | 65.0% | 59.9% | 55.9% | 54.7% |
| Metal | Ag | Ag | Ag | Ag | Ag | Ag | Ag | Ag | Ag | Ag |
| Particle Diameter | 5 μm | 5 μm | 5 μm | 5 μm | 5 μm | 5 μm | 5 μm | 5 μm | 5 μm | 5 μm |
| Metal Oxide | — | — | $Al_2O_3$ | — | — | — | $Al_2O_3$ | — | — | — |
| Particle Diameter | — | — | 1 μm | — | — | — | 1 μm | — | — | — |
| Vehicle | Rosin-modified type | Rosin-modified type | Rosin-modified type | Rosin-modified type | Cellu-lose type | Cellu-lose type | Cellu-lose type | Cellu-lose type | Cellu-lose type | Rosin-modified type |
| Composition Behavior | Plastic fluid | Plastic fluid | Plastic fluid | Plastic fluid | Plastic fluid | Plastic fluid | Plastic fluid | Plastic fluid | Viscous material | Viscous material |
| Voids @ 1.0 mm × 1.0 mm via-holes | OK | OK | OK | Marginal | OK | OK | OK | Marginal | NG | NG |
| Voids @ 2.8 mm × 2.8 mm via-holes | OK | OK | OK | Marginal | OK | OK | OK | Marginal | NG | NG |

Example 2-1 is a sample containing 1 wt % of $Al_2O_3$ (particle diameter: 1 μm) based on 100 wt % of Example 2.

Example 5-1 is a sample containing 1 wt % of $Al_2O_3$ (particle diameter: 1 μm) based on 100 wt % of Example 5.

$Al_2O_3$ density: 4.0 g/cm³

900° C. or lower selected from the group consisting of $Al_2O_3$, $SiO_2$, $TiO_2$, MnO, MgO, $ZrO_2$, CaO, BaO and $Co_2O_3$, a compound oxide thereof or a metal resinate at 0.1 to 10 wt % based on the total weight of the composition, wherein the vehicle is a binder resin selected from the group consisting of an ethyl cellulose resin and rosin-modified resin.

2. The electrically conductive composition according to claim 1, wherein the electrically conductive metal is a metal selected from the group consisting of gold, silver, copper, palladium, platinum, nickel and aluminum, or an alloy thereof.

3. The electrically conductive composition according to claim 1, wherein the electrically conductive metal is a spherical powder having a mean particle diameter of 0.8 μm to 8 μm.

4. The electrically conductive composition according to claim 1, wherein the mean particle diameter of the inorganic oxide or the compound oxide is 0.03 to 5 μm.

5. The electrically conductive composition according to claim 1, wherein the mean particle diameter of the glass powder is 0.1 to 5 μm.

\* \* \* \* \*